(12) United States Patent
Anzai et al.

(10) Patent No.: US 7,939,831 B2
(45) Date of Patent: *May 10, 2011

(54) SEMICONDUCTOR DEVICE AND METHOD OF MANUFACTURING THE SAME

(75) Inventors: Aya Anzai, Tsukui (JP); Junya Maruyama, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/480,740

(22) Filed: Jun. 9, 2009

(65) Prior Publication Data

US 2009/0250703 A1    Oct. 8, 2009

Related U.S. Application Data

(60) Continuation of application No. 11/107,821, filed on Apr. 18, 2005, now Pat. No. 7,554,169, and a division of application No. 10/735,710, filed on Dec. 16, 2003, now Pat. No. 6,881,975.

(30) Foreign Application Priority Data

Dec. 17, 2002  (JP) ................................. 2002-365566

(51) Int. Cl.
*H01L 25/13* (2006.01)
*H01L 25/075* (2006.01)

(52) U.S. Cl. ............ 257/72; 257/59; 257/773; 257/786; 257/E25.021; 257/E25.028

(58) Field of Classification Search ............ 257/59, 257/72, 773, 786, E25.021, E25.028
See application file for complete search history.

(56) References Cited

U.S. PATENT DOCUMENTS

| | | | |
|---|---|---|---|
| 5,473,261 | A | 12/1995 | Marumoto et al. |
| 5,821,138 | A | 10/1998 | Yamazaki et al. |
| 6,372,608 | B1 | 4/2002 | Shimoda et al. |
| 6,376,333 | B1 | 4/2002 | Yamazaki et al. |
| 6,392,217 | B1 | 5/2002 | Teranuma et al. |
| 6,627,518 | B1 | 9/2003 | Inoue et al. |
| 6,682,963 | B2 | 1/2004 | Ishikawa |
| 6,846,703 | B2 | 1/2005 | Shimoda et al. |
| 6,882,102 | B2 | 4/2005 | Yamazaki |
| 6,946,361 | B2 | 9/2005 | Takayama et al. |
| 6,949,749 | B2 | 9/2005 | Tokuda et al. |
| 7,005,671 | B2 | 2/2006 | Yamazaki et al. |
| 7,030,551 | B2 | 4/2006 | Yamazaki et al. |

(Continued)

FOREIGN PATENT DOCUMENTS

EP    0 986 104    3/2000

(Continued)

*Primary Examiner* — David Vu
*Assistant Examiner* — Earl N Taylor
(74) *Attorney, Agent, or Firm* — Eric J. Robinson; Robinson Intellectual Property Law Office, P.C.

(57) ABSTRACT

It is provided a contacting method when a plurality of films to be peeled are laminating. Reduction of total layout area, miniaturization of a module, weight reduction, thinning, narrowing a frame of a display device, or the like can be realized by sequentially laminating a plurality of films to be peeled which are once separately formed over a plastic film or the like. Moreover, reliable contact having high degree of freedom is realized by forming each layer having a connection face of a conductive material and by patterning with the use of a photomask having the same pattern.

20 Claims, 8 Drawing Sheets

U.S. PATENT DOCUMENTS

| | | |
|---|---|---|
| 7,045,438 B2 | 5/2006 | Yamazaki et al. |
| 7,109,071 B2 | 9/2006 | Ishikawa |
| 7,180,091 B2 | 2/2007 | Yamazaki et al. |
| 7,211,828 B2 | 5/2007 | Yamazaki et al. |
| 7,218,349 B2 | 5/2007 | Kimura |
| 7,332,381 B2 | 2/2008 | Maruyama et al. |
| 7,351,300 B2 | 4/2008 | Takayama et al. |
| 7,554,169 B2 * | 6/2009 | Anzai et al. .................. 257/444 |
| 2003/0032210 A1 | 2/2003 | Takayama et al. |

FOREIGN PATENT DOCUMENTS

| | | |
|---|---|---|
| EP | 1 020 748 | 7/2000 |
| EP | 1017100 A | 7/2000 |
| EP | 1603163 A | 12/2005 |
| JP | 61-099362 | 5/1986 |
| JP | 62-145760 | 6/1987 |
| JP | 06-347813 | 12/1994 |
| JP | 07-014982 A | 1/1995 |
| JP | 08-125120 | 5/1996 |
| JP | 08-288522 | 11/1996 |
| JP | 11-251518 A | 9/1999 |
| JP | 2002-228759 | 8/2002 |
| JP | 2003-298012 | 10/2003 |
| WO | WO 99/44236 | 2/1999 |
| WO | WO 99/44236 | 9/1999 |

* cited by examiner

SEMICONDUCTOR DEVICE AND METHOD OF MANUFACTURING THE SAME

TECHNICAL FIELD

The present invention relates to a contacting method among a plurality of films to be peeled, specifically, a contacting method among films to be peeled that include various elements. In addition, the present invention also relates to a semiconductor device having a semiconductor integrated circuit or a thin film transistor (hereinafter, referred to as a TFT) in which a film to be peeled is attached to a substrate and is fixed thereto.

In this specification, the term "semiconductor device" refers to devices that can operate by utilizing semiconductor characteristics. A display device, a semiconductor circuit, and an electronic device using PDP, EL, or liquid crystal are all included in the semiconductor device.

BACKGROUND ART

As for a technique for forming a semiconductor integrated circuit, a TFT, or the like over an insulating substrate by using a semiconductor thin film, an attempt to use a flexible substrate typified by a flexible plastic film or the like as the insulating substrate has been made in recent years from the viewpoint of improving durability or reducing weight.

However, compared with glass, quartz, or the like which is generally used as an insulating substrate at present, a plastic film has low heat resistance and has a limitation on processing temperature in a step of forming a TFT. Therefore, it is difficult to directly form a TFT over a plastic substrate and to obtain high properties.

Then, a technique for peeling a TFT that is once formed over glass, quartz, or the like off a substrate and fixing to a plastic film or the like has recently been proposed (for example, Japanese Patent Laid-Open No. 8-288522).

In this specification, the terms "film to be peeled" refer to a film including a semiconductor integrated circuit, a TFT, or the like which is once formed over glass, quartz, or the like.

DISCLOSURE OF THE INVENTION

Problem to be Solved by the Invention

Reduction of total layout area, weight reduction, thinning, or the like can be realized by using a technique for fixing a film to be peeled to a plastic film or the like and by sequentially laminating a plurality of films to be peeled which are once separately formed. However, it is difficult to form a contact hole for connecting a film to be peeled to another film to be peeled at the time of laminating.

The present invention has been made in view of the foregoing problem, and has an object to provide a contacting method when laminating a plurality of films to be peeled.

Means to Solve the Problem

In a semiconductor device in which a plurality of films to be peeled are separately formed and laminated, a face on which two different films to be peeled that are sequentially laminated are in contact with each other has at least the same pattern made of a conductive material. The two different films to be peeled are connected, thereby realizing reliable contact having high degree of freedom.

In a semiconductor device of the present invention, it is characterized by following. A film having an insulating layer, a conductive layer, and a semiconductor layer that is formed over a first substrate is peeled off the first substrate, and then, is fixed to a second substrate. A plurality of films to be peeled are laminated over the second substrate. A face on which two of the different films to be peeled that are sequentially laminated are in contact with each other has at least the same pattern made of a conductive material.

According to the present invention, the film to be peeled may have at least one of a thin film transistor, a capacitor means, a resistor means, a memory element, a thin film diode, and a photoelectric conversion element.

According to the present invention, a display portion including a plurality of pixels arranged in a matrix may be included in the plurality of films to be peeled.

According to the present invention, an EL element or liquid crystal may be used for the display portion.

It is characterized in that a semiconductor device of the present invention comprises a first film and a second film which are sequentially laminated over a substrate, wherein the first film and the second film each have at least one insulating layer, one conductive layer, and one semiconductor layer, and a face on which the first film and the second film are in contact with each other is made of the conductive layer and at least has the same pattern.

According to the present invention, the first film and the second film may have at least one of a thin film transistor, a capacitor means, a resistor means, a memory element, a thin film diode, and a photoelectric conversion element.

According to the present invention, the first film and the second film may have a display portion including a plurality of pixels arranged in a matrix.

According to the present invention, an EL element or liquid crystal may be used for the display portion.

It is characterized in that a method for manufacturing a semiconductor device of the present invention comprises the steps of: forming a film having an insulating layer, a conductive layer, and a semiconductor layer over a first substrate; peeling the film having an insulating layer, a conductive layer, and a semiconductor layer off the first substrate; and laminating a plurality of the films having an insulating layer, a conductive layer, and a semiconductor layer over a second substrate, wherein a face on which the two different films having an insulating layer, a conductive layer, and a semiconductor layer are in contact with each other at least has the same pattern made of a conductive material, and the two different films are connected by contact of the same patterns with each other.

It is characterized in that a method for manufacturing a semiconductor device of the present invention comprises the steps of: forming a peel layer over a first substrate; forming a film having an insulating layer, a conductive layer, and a semiconductor layer over the peel layer; peeling the film having an insulating layer, a conductive layer, and a semiconductor layer off the first substrate; and laminating a plurality of the films having an insulating layer, a conductive layer, and a semiconductor layer over a second substrate, wherein a face on which the two different films having an insulating layer, a conductive layer, and a semiconductor layer are in contact with each other at least has the same pattern made of a conductive material, and the two different films are connected by contact of the same patterns with each other.

According to the present invention, a step of removing the peel layer may be provided between the step of peeling the film having an insulating layer, a conductive layer, and a semiconductor layer off the first substrate and the step of laminating a plurality of the films having an insulating layer, a conductive layer, and a semiconductor layer over the second substrate.

According to the present invention, the second substrate may have a flat surface or a curved surface.

It is characterized in that a method for manufacturing a semiconductor device of the present invention comprises the steps of: forming a first film in which a first insulating layer, a first conductive layer, and a first semiconductor layer are formed over a first substrate; forming a second film having a second insulating layer, a second conductive layer having at least the same pattern as the first conductive layer, and a second semiconductor layer over a second substrate; fixing the first film to a third substrate after peeling the first film off the first substrate; and laminating the second film over the first film fixed to the third substrate after peeling the second film off the second substrate, wherein the first film and the second film are connected by contact of the same patterns with each other in the step of laminating.

According to the present invention, the first conductive layer and the second conductive layer may each at least have the same pattern on a face on which the first film and the second film are in contact with each other.

According to the present invention, a peel layer may be formed between the first substrate and the first film.

According to the present invention, a step of removing the peel layer may be provided between the step of peeling the first film off the first substrate and the step of fixing the first film to the third substrate.

According to the present invention, a peel layer may be formed between the second substrate and the second film.

According to the present invention, a step of removing the peel layer may be provided between the step of peeling the second film off the second substrate and the step of laminating the second film over the first film.

According to the present invention, the third substrate may have a flat surface or a curved surface.

It is characterized in that a method for manufacturing a semiconductor device of the present invention comprises the steps of: forming a first film in which a first insulating layer, a first conductive layer, and a first semiconductor layer are formed over a first substrate; forming a second film having a second insulating layer, a second conductive layer at least having the same pattern as the first conductive layer, and a second semiconductor layer over a second substrate; peeling the first film off the first substrate by fixing a third substrate to the first film; fixing the peeled first film to a fourth substrate; peeling the second film off the second substrate by fixing the second film to a fifth substrate; and laminating the peeled second film over the first film fixed to the fourth substrate, wherein the first film and the second film are connected by contact of the same patterns with each other in the step of laminating.

According to the present invention, the first conductive layer and the second conductive layer may each at least have the same pattern on a face on which the first film and the second film are in contact with each other.

According to the present invention, a peel layer may be formed between the first substrate and the first film.

According to the present invention, a step of removing the peel layer may be provided between the step of peeling the first film off the first substrate and the step of fixing the first film to the fourth substrate.

According to the present invention, a peel layer may be formed between the second substrate and the second film.

According to the present invention, a step of removing the peel layer may be provided between the step of peeling the second film off the second substrate and the step of laminating the second film over the first film.

According to the present invention, the fourth substrate may have a flat surface or a curved surface.

Effect of the Invention

Miniaturization of total layout area and a module, weight reduction, thinning, narrowing a frame of a display device, or the like can be realized by sequentially laminating a plurality of films to be peeled which are once separately formed over a plastic film or the like. Moreover, reliable contact having high degree of freedom is realized by forming each layer having a connection face of a conductive material and by patterning with the use of a photomask at least having the same pattern. In addition, the layer having a connection face can be used as a wiring layer.

BEST MODE FOR CARRYING OUT THE INVENTION

This embodiment mode is described with reference to FIG. 1.

A film to be peeled A 1001 and a film to be peeled B 1002, each of which is formed in advance over a substrate such as glass, are fixed to a substrate 1003 using a plastic film or the like to laminate the film to be peeled B 1002 and the film to be peeled A 1001 in this order. When the film to be peeled B 1002 is formed, a conductive film is formed as a top layer to be a contact face with the film to be peeled A 1001 and is patterned by using a photomask B to form a connecting portion B 1005.

Further, when the film to be peeled A 1001 is formed, a conductive film is formed as a bottom layer to be a contact face with the film to be peeled B 1002 and is patterned by using a photomask A to form a connecting portion A 1004. The photomask A and the photomask B at least have the same pattern, and are contacted at every same pattern when laminated. The connecting portion A 1004 and the connecting portion B 1005 may have completely the same pattern, or may have the same pattern at least partially.

When the films to be peeled are fixed, a filmy or pasty anisotropic conductive adhesive is interposed between the film to be peeled and the film to be peeled, thereby fixing the films to be peeled to each other. The anisotropic conductive adhesive is made of a mixture of an insulating adhesive material and a conductive filling material and has conductivity only in the direction of Z-axis.

Figure 1:
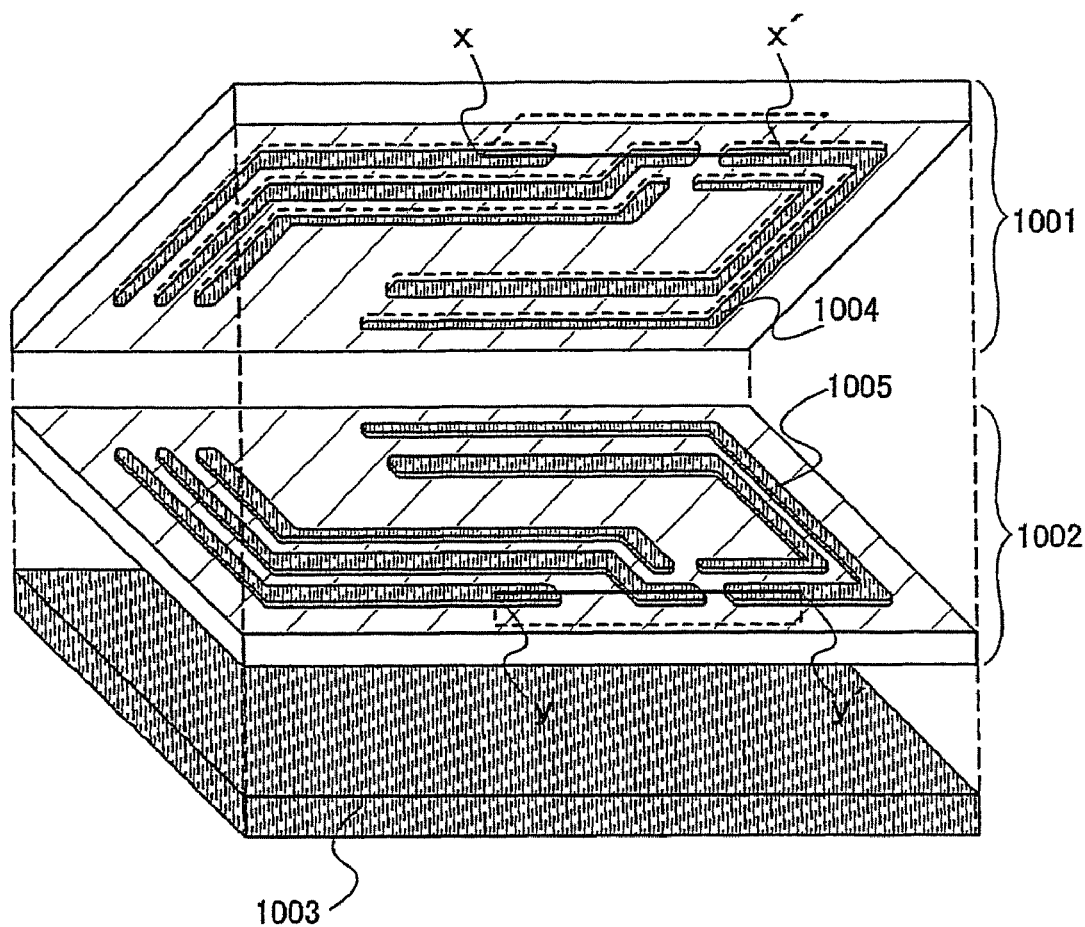
FIG. 1 is a figure which shows an embodiment mode of the present invention.
Figure 2:
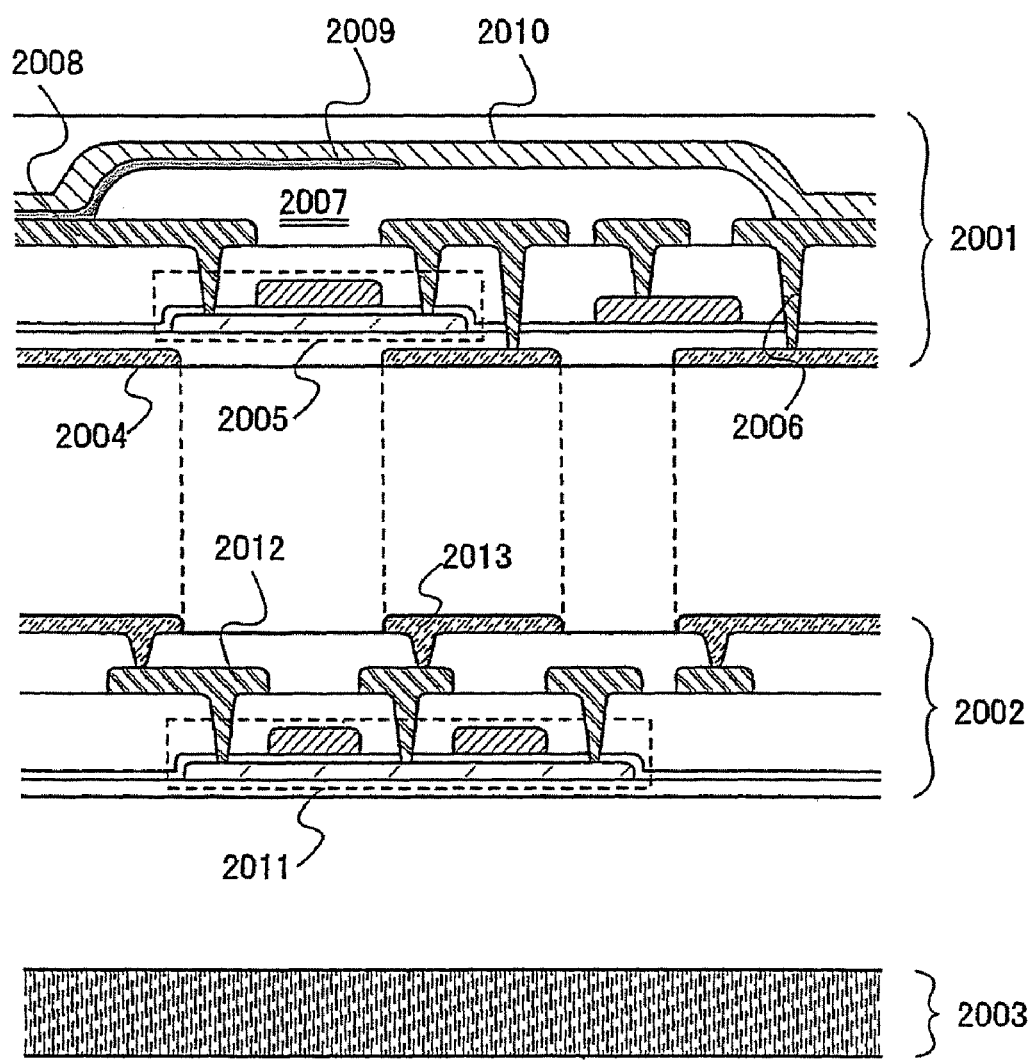
FIG. 2 is a figure which shows an embodiment mode of the present invention.

Reference numeral 2001 in FIG. 2 shows an example of a cross-sectional view taken along a line x-x' in FIG. 1, and reference numeral 2002 in FIG. 2 shows an example of a cross-sectional view taken along a line y-y' in FIG. 1.

For example, a film including a pixel portion of an EL display device is regarded as a film to be peeled A 2001, and a film including a driver circuit portion is regarded as a film to be peeled B 2002. A substrate 2003 is a substrate using a plastic film or the like. A connecting potion A 2004 is formed as a bottom layer of the film to be peeled A 2001, and a TFT 2005 and a wiring are formed over the connecting portion A 2004. A bank 2007 is formed on an edge of a pixel electrode 2008 that is connected to either a source electrode or a drain electrode of the TFT 2005. An EL layer 2009 is formed over an opening of the pixel electrode 2008, and furthermore, an opposite electrode 2010 is formed thereover.

A connecting potion B 2013 is formed as a top layer of the film to be peeled B 2002, and a wiring 2012 and a TFT 2011 are formed therebelow. The film to be peeled B 2002 and the film to be peeled A are fixed to the plastic substrate 2003 in this order and are laminated. Since the connecting portion A 2004 and the connecting portion B 2013 are formed to have at least the same pattern, they are contacted at every same pattern. A first wiring 2006 and a third wiring 2012 are made conductive and a second wiring 2007 and a fourth wiring 2013 are made conductive. The connecting portion A 2004 and the connecting portion B 2013 may have completely the same pattern, or may have the same pattern at least partially.

Moreover, the top layer and the bottom layer are a top layer and a bottom layer seen from a substrate side when laminated over the substrate 2003, and there is no need to be a top layer and a bottom layer when forming a film to be peeled. A protective film, a peel layer, or the like may be formed as needed and may be removed in a fixing step.

More particularly, fixing and laminating steps are described with reference to FIGS. 6A to 6C, 7A to 7C, 8A and 8B.

Figure 6A:
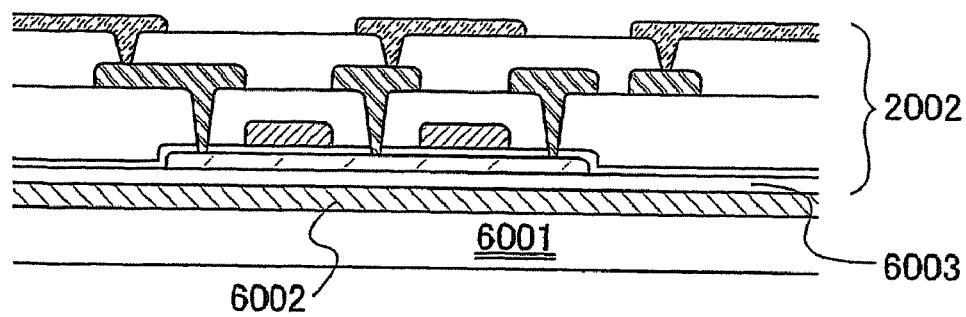
FIGS. 6A to 6C are figures which show steps of an embodiment mode of the present invention.
Figure 6B:
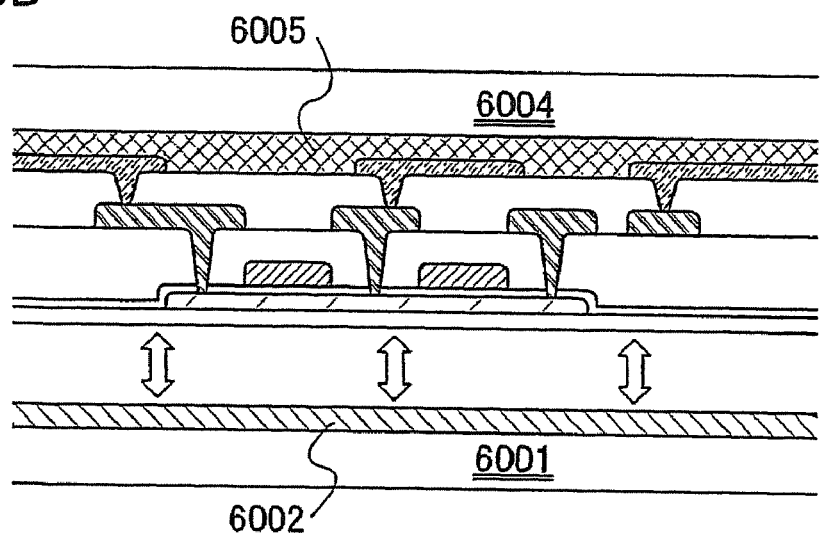

First, in a first step shown in FIG. 6A, a first peel layer 6002, a second peel layer 6003, a film B 2002 including a driver circuit portion are formed over a first substrate 6001 using glass or the like. Subsequently, in a second step shown in FIG. 6B, a second substrate 6004 using glass or the like is fixed with a first adhesive 6005 using a water-soluble adhesive or the like. The first substrate 6001 is peeled off the film B 2002 including a driver circuit portion with the film B 2002 including a driver circuit portion remained on a side of the second substrate 6004. At this time, the first substrate 6001 and the film B 2002 including a driver circuit portion are peeled off at a boundary surface between the first peel layer 6002 and the second peel layer 6003.

Figure 6C:
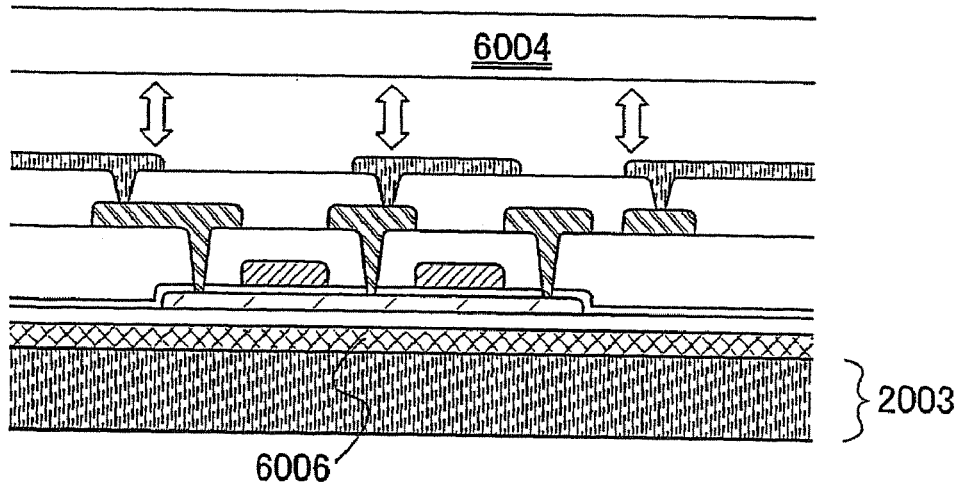

Next, in a third step shown in FIG. 6C, a second adhesive 6006 using an epoxy adhesive or the like is applied onto the substrate 2003, and the film B 2002 including a driver circuit portion is fixed thereto. Subsequently, the first adhesive 6005 is removed by using water or the like, thereby peeling the second substrate 6004 off the film to be peeled B 2002.

Figure 7A:
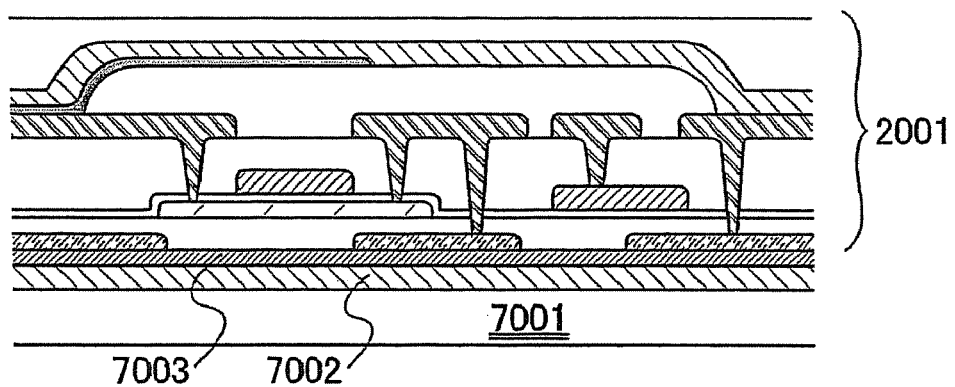
FIGS. 7A to 7C are figures which show steps of an embodiment mode of the present invention.
Figure 7B:
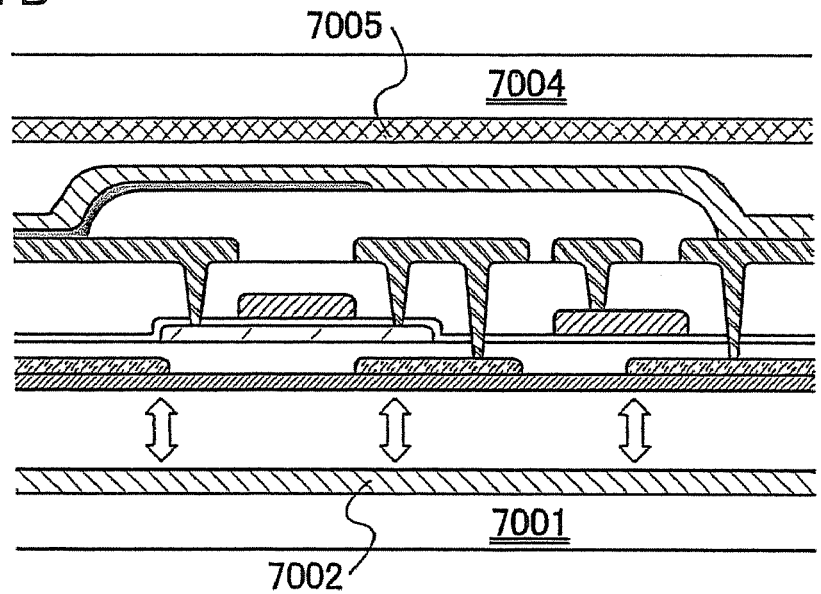

In a fourth step shown in FIG. 7A, a third peel layer 7002, a fourth peel layer 7003, a film A 2001 including a pixel portion are formed over a third substrate 7001 using glass or the like. Subsequently, in a fifth step shown in FIG. 7B, a fourth substrate 7004 is fixed with a third adhesive 7005 using a water-soluble adhesive or the like. Then, the third substrate 7001 is peeled off the film A 2001 including a pixel portion with the film A 2001 including a pixel portion remained on a side of the fourth substrate 7004. At this time, the third substrate 7001 and the film A 2001 including a pixel portion are peeled off at a boundary surface between the third peel layer 7002 and the fourth peel layer 7003.

Figure 7C:
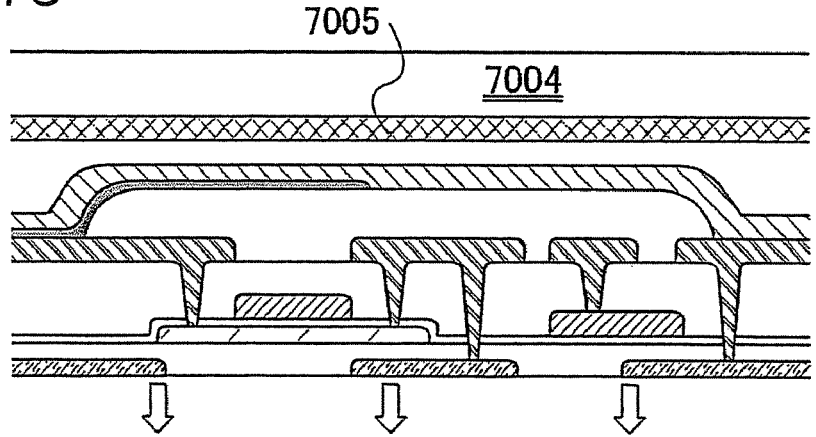

Next, in a sixth step shown in FIG. 7C, the fourth peel layer 7003 is removed by CMP (Chemical Mechanical Polishing). Subsequently, in a seventh step shown in FIG. 8A, an anisotropic conductive adhesive 8001 is interposed between the film A 2001 including a pixel portion and the film to be peeled B 2002 to fix.

Figure 8A:
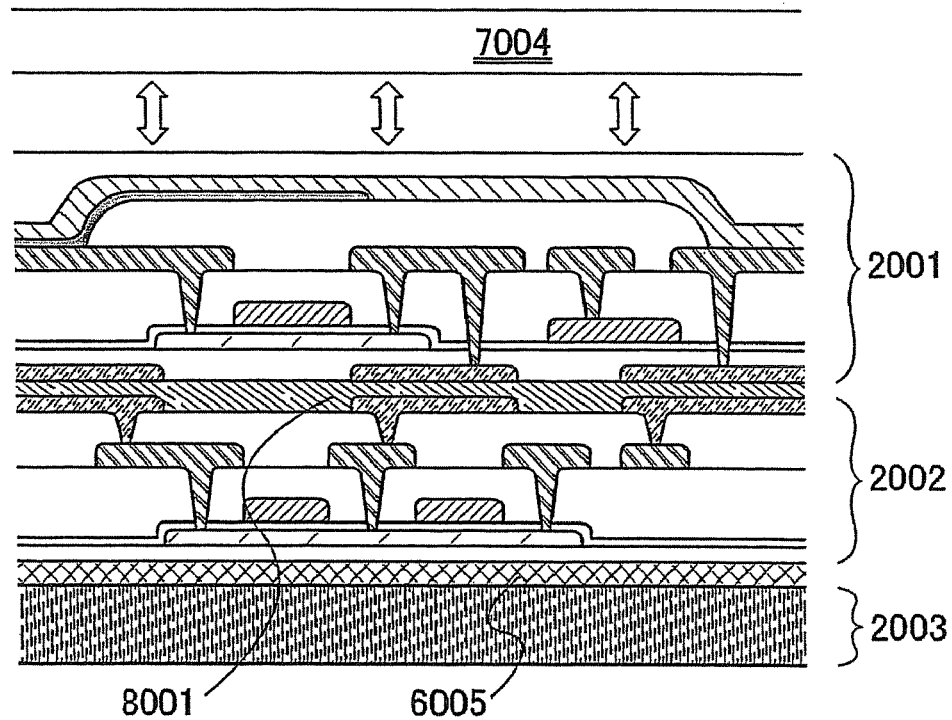
FIGS. 8A and 8B are figures which show steps of an embodiment mode of the present invention.
Figure 8B:
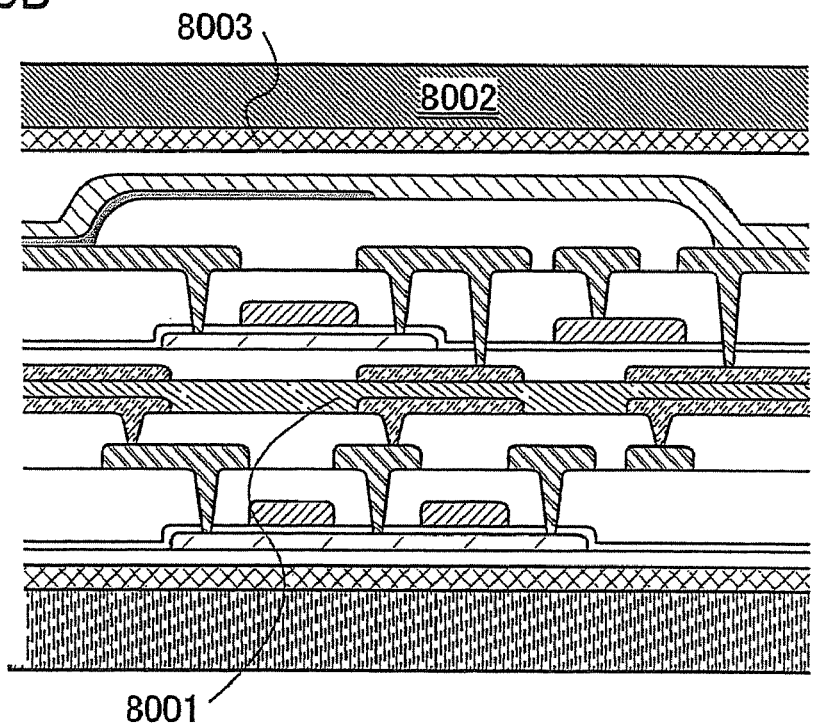

Thereafter, in an eighth step shown in FIG. 8B, the third adhesive 7005 may be removed to peel the fourth substrate 7004 off the film A 2001 including a pixel portion, and a sealing substrate 8002 using a plastic film or the like may be fixed with a fourth adhesive 8003.

Further, CMP is employed to remove the peel layer in the above description; however, another mechanical technique or another scientific technique such as etching may also be employed.

As a method for fixing films to be peeled to each other, the case of using an anisotropic conductive adhesive is described in this embodiment mode; however, the films to be peeled may be fixed by applying an adhesive to a top layer or a bottom layer of the film to be peeled. In this case, thickness of the adhesive needs to be adjusted so that connecting portions are connected with low resistance. In addition, the film to be peeled may be sealed by using an opposite substrate, and the films to be peeled may be fixed to each other with the adhesive used at the time or by applying pressure.

In this embodiment mode, the case of laminating two films to be peeled is described. However, also in the case of laminating three or more films, at least the same pattern made of a conductive material may be formed on a contact face of two different films to be peeled which are sequentially laminated and are in contact with each other, so as to be in contact. The pattern made of a conductive material may be completely the same, or may be at least partially the same.

In addition, the EL display device is described here as an example; however, the present invention may be applied to other light emitting devices or to a liquid crystal display device.

Embodiment 1

Figure 3:
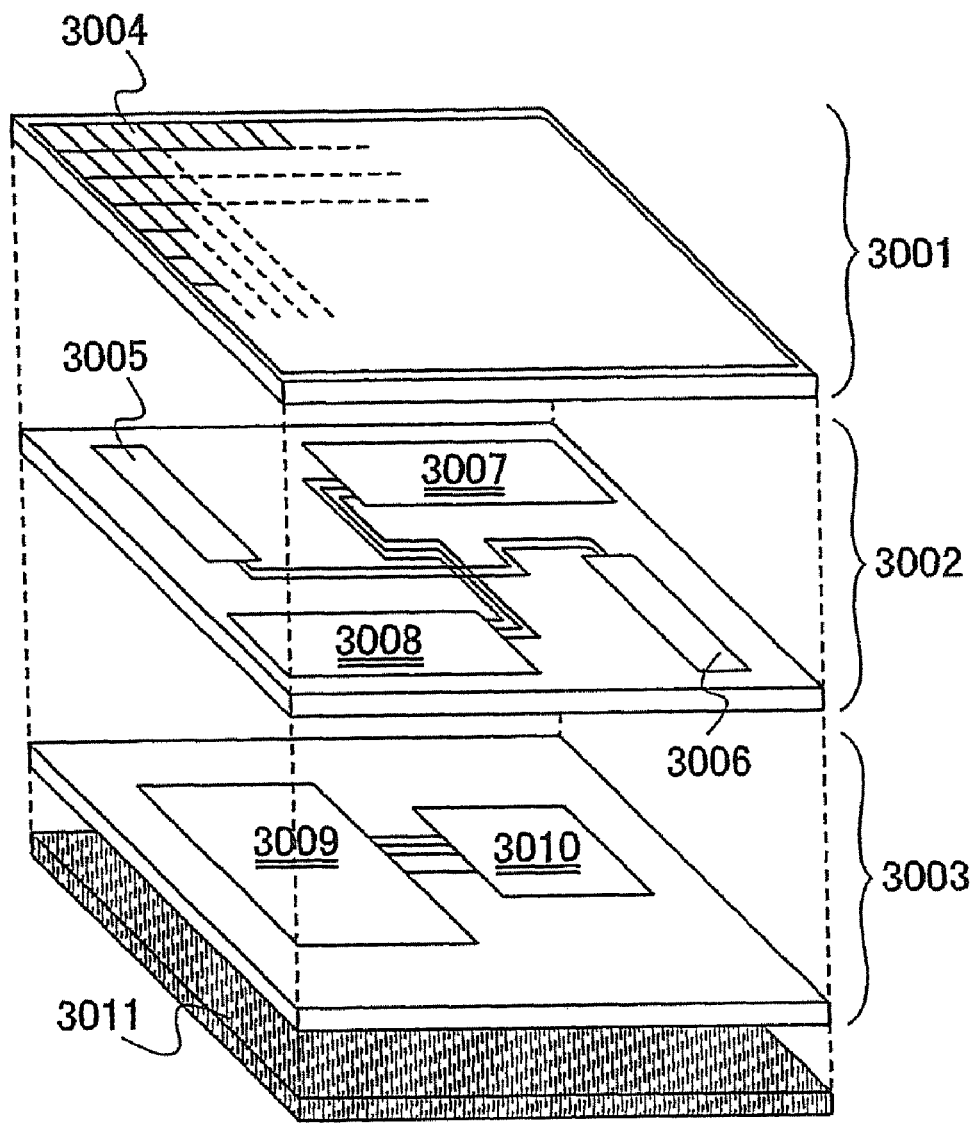
FIG. 3 is a figure which shows a structural example of a display device to which the present invention is applied.

A display device using a contacting method of this embodiment mode is described with reference to FIG. 3.

A film to be peeled C 3003 is a controller portion, which includes a power supply portion 3009 and a signal generating portion 3010. A film to be peeled B 3002 is a driver circuit portion, which includes a first horizontal scanning line driver circuit 3005, a second horizontal scanning line driver circuit 3006, a first vertical scanning line driver circuit 3007, and a second vertical scanning line driver circuit 3008. A film to be peeled A 3001 is a pixel portion, which includes a plurality of pixels 3004 arranged in a matrix.

At the power supply portion 3009 in the controller portion, each power supply of a desired voltage is generated from a power supply supplied from a battery or an outlet, and is supplied to the driver circuit portion, the signal generating portion 3010, and the like. A power supply, a video signal, a synchronizing signal, and the like are applied to the signal generating portion 3010, and various signals are converted. In addition, a clock signal and the like are generated, and are supplied to the driver circuit portion.

At the first horizontal scanning line driver circuit 3005 and the second horizontal scanning line driver circuit 3006 in the driver circuit portion, a pulse which sequentially selects a horizontal scanning line from the first row to the last row using the inputted power source, signal, and the like is generated, and is supplied to the pixel portion. At the first vertical scanning line driver circuit 3007 and the second vertical scanning line driver circuit 3008, a video signal is converted with the use of the inputted power source, signal, or the like, and is supplied to the pixel portion.

At the pixel portion, the video signal is inputted into each pixel with the use of the inputted selecting pulse, video signal, or the like, and an image is displayed.

The same pattern made of a conductive material is formed as a bottom layer of the film to be peeled A 3001 and a top layer of the film to be peeled B 3002. The same pattern made of a conductive material is at least formed as a bottom layer of the film to be peeled B 3002 and a top layer of the film to be peeled C 3003.

The film to be peeled C 3003, the film to be peeled B 3002, and the film to be peeled A 3001 are sequentially transferred to a plastic substrate 3011. The film to be peeled A and the film to be peeled B, and the film to be peeled B and the film to be peeled C can be in contact respectively by connecting portions of the same patterns made of a conductive material.

Since area equivalent to the pixel portion can be used for the driver circuit portion, a layout with high degree of freedom can be obtained.

Embodiment 2

Figure 5A:
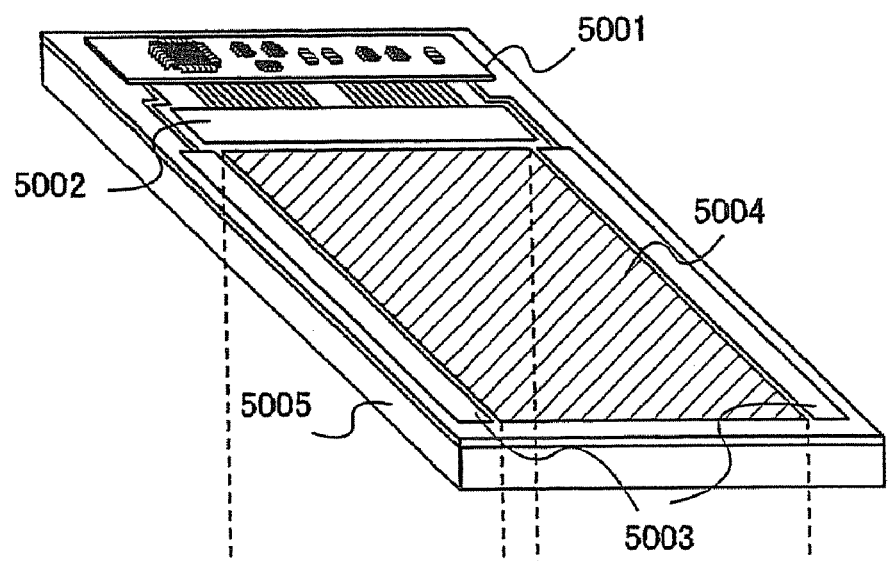
FIGS. 5A-5B are comparative diagrams of a conventional display device and a display device to which the present invention is applied.
Figure 5B:
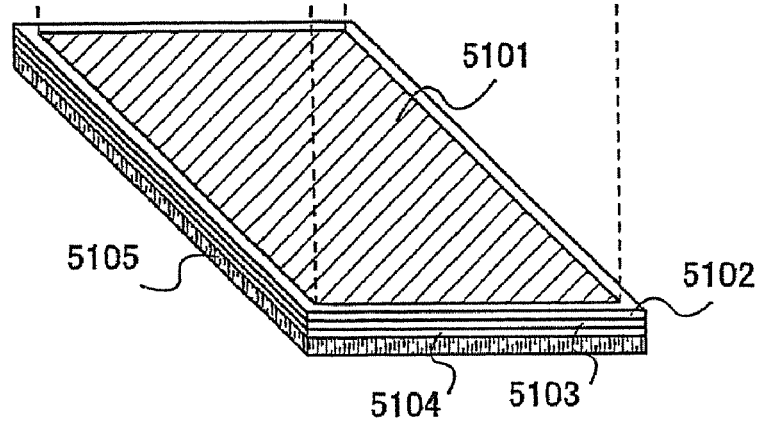

FIG. 5A shows an example of a conventional display device, and FIG. 5B shows an example of a display device using the present invention.

A general display device has a controller portion, a driver circuit portion, a display portion, and the like. A conventional display device shown in FIG. 5A has a driver circuit portion such as a vertical scanning line driver circuit 5002 and a horizontal scanning line driver circuit 5003, a display portion 5004, and a controller portion 5001 including an IC chip or the like, which are all formed over a glass substrate 5005.

A display device using the present invention shown in FIG. 5B, has a film to be peeled C 5104 including a controller portion, a film to be peeled B 5103 including a driver circuit portion, and a film to be peeled A 5102 including a display portion 5101 over a plastic substrate 5105. Compared with the conventional display device, the display device using the present invention is effective for miniaturizing the display device as a whole and narrowing a frame since the driver circuit portion, the controller portion, and the display portion can be laminated and disposed. In addition, the display device using the present invention is also effective for thinning, reducing weight, and improving durability, since a plastic substrate or the like is used.

In the case of applying the present invention to a transmissive liquid crystal display device, a film to be peeled including a back light portion using a light emitting element such as an EL element may be disposed below a film to be peeled including a display portion.

A display device of the present invention can be used for a display portion of various electronic devices. Specifically, a display device of the present invention is preferably used for a mobile device that is required to be thin and lightweight.

Such electric devices are specifically as follows: a personal digital assistant (a cellular phone, a mobile computer, a mobile game machine, an electronic book, or the like), a video camera, a digital camera, a goggle type display, a display unit, a navigation system, and the like. Specific examples of the electric devices are described with reference to FIGS. 4A to 4D.

Figure 4A:
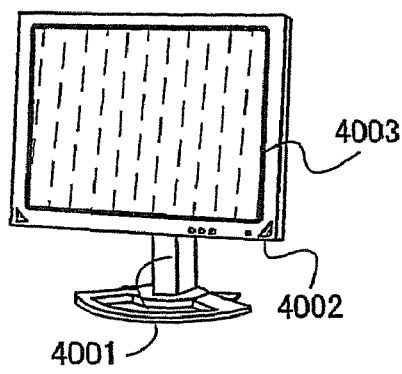
FIGS. 4A to 4D are figures which show examples of electronic devices to which the present invention can be applied.

FIG. 4A shows a display unit, which includes a chassis 4001, a voice output portion 4002, a display portion 4003, and the like. A display device of the present invention can be used for the display portion 4003. The display device includes all display devices for displaying information, including ones for personal computers, for TV broadcasting reception, and for advertisement.

Figure 4B:
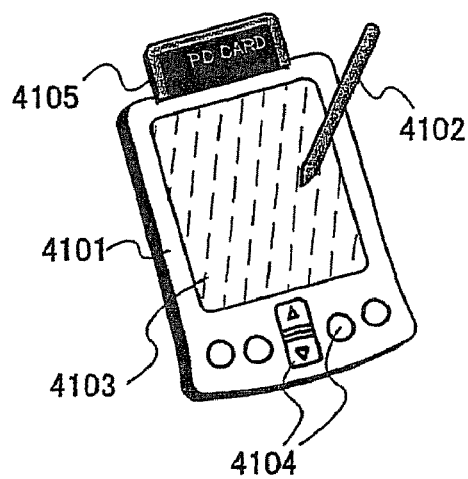

FIG. 4B shows a mobile computer, which includes a main body 4101, a stylus 4102, a display portion 4103, operation buttons 4104, an external interface 4105, and the like. A display device of the present invention can be used for the display portion 4103.

Figure 4C:
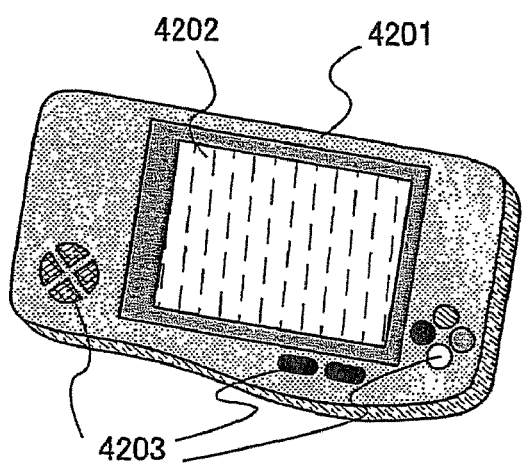

FIG. 4C shows a game machine, which includes a main body 4201, a display portion 4202, operation buttons 4203, and the like. A display device of the present invention can be used for the display portion 4202.

Figure 4D:
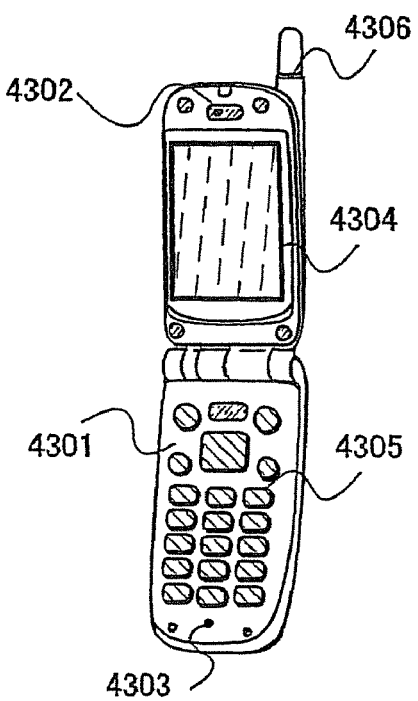

FIG. 4D shows a cellular phone, which includes a main body 4301, a voice output portion 4302, an audio input portion 4303, a display portion 4304, operation switches 4305, an antenna 4306, and the like. A display device of the present invention can be used for the display portion 4304.

As described above, the applicable range of the present invention is so wide that the present invention can be applied to electronic devices of various fields. Particularly, it is capable of thinning, reducing weight, miniaturizing a module, and narrowing a frame; therefore, it may be used for such a display device as shown in FIGS. 4A to 4D.

What is claimed is:

1. A semiconductor device comprising:
   a first film comprising a first thin film transistor and a first connecting portion including a first patterned conductive material, over a substrate;
   a second film comprising a second thin film transistor and a second connecting portion including a second patterned conductive material, over the first film;
   a first adhesive which fixes the first film to the substrate; and
   a second adhesive interposed between the first film and the second film,
   wherein the first connecting portion is electrically connected to the second connecting portion, and
   wherein the first patterned conductive material has at least a same pattern as the second patterned conductive material, and the same pattern has at least one reentrant angle and at least five salient angles.

2. The device according to claim 1, wherein the first thin film transistor is electrically connected to the first connecting portion.

3. The device according to claim 1, wherein the first connecting portion is formed over the first thin film transistor and electrically connected to the first thin film transistor.

4. The device according to claim 1, wherein the second adhesive is an anisotropic conductive adhesive.

5. The device according to claim 1, wherein the substrate is a flexible substrate.

6. The device according to claim 1, wherein the semiconductor device is incorporated into an electronic device selected from the group consisting of a cellular phone, a mobile computer; a mobile game machine, and a display unit.

7. A semiconductor device comprising:
   a first film comprising a first thin film transistor and a first connecting portion including a first patterned conductive material, over a substrate;
   a second film comprising a first electrode, an EL layer, a second electrode, and a second connecting portion including a second patterned conductive material, over the first film;
   a first adhesive which fixes the first film to the substrate; and a second adhesive interposed between the first film and the second film, wherein the first connecting portion is electrically connected to the second connecting portion, and wherein the first patterned conductive material has at least a same pattern as the second patterned conductive material, and the same pattern has at least one reentrant angle and at least five salient angles.

8. The device according to claim 7, wherein the first thin film transistor is electrically connected to the first connecting portion.

9. The device according to claim 7, wherein the first connecting portion is formed over the first thin film transistor and electrically connected to the first thin film transistor.

10. The device according to claim 7, wherein the second film further comprises a second thin film transistor.

11. The device according to claim 7, wherein the second adhesive is an anisotropic conductive adhesive.

12. The device according to claim 7, wherein the substrate is a flexible substrate.

13. The device according to claim 7, wherein the semiconductor device is incorporated into an electronic device selected from the group consisting of a cellular phone, a mobile computer, a mobile game machine, and a display unit.

14. A semiconductor device comprising:
a first film comprising a first electrode, an EL layer, a second electrode, and a first connecting portion including a first patterned conductive material, over a substrate;
a second film comprising a first thin film transistor and a second connecting portion including a second patterned conductive material, over the first film; and
a first adhesive which fixes the first film to the substrate; and
a second adhesive interposed between the first film and the second film, wherein the first connecting portion is electrically connected to the second connecting portion, and wherein the first patterned conductive material has at least a same pattern as the second patterned conductive material, and the same pattern has at least one reentrant angle and at least five salient angles.

15. The device according to claim 14, wherein the first thin film transistor is electrically connected to the second connecting portion.

16. The device according to claim 14, wherein the first thin film transistor is formed over the second connecting portion and electrically connected to the second connecting portion.

17. The device according to claim 14, wherein the first film further comprises a second thin film transistor.

18. The device according to claim 14, wherein the second adhesive is an anisotropic conductive adhesive.

19. The device according to claim 14, wherein the substrate is a flexible substrate.

20. The device according to claim 14, wherein the semiconductor device is incorporated into an electronic device selected from the group consisting of a cellular phone, a mobile computer, a mobile game machine, and a display unit.

* * * * *